United States Patent [19]
Pickering et al.

[11] Patent Number: 5,474,613
[45] Date of Patent: Dec. 12, 1995

[54] CHEMICAL VAPOR DEPOSITION FURNACE AND FURNACE APPARATUS

[75] Inventors: Michael A. Pickering, Dracut; Jitendra S. Goela, Andover; Lee E. Burns, Woburn, all of Mass.

[73] Assignee: CVD, Incorporated, Woburn, Mass.

[21] Appl. No.: 432,342

[22] Filed: May 1, 1995

Related U.S. Application Data

[62] Division of Ser. No. 340,981, Nov. 17, 1994, which is a division of Ser. No. 959,880, Oct. 13, 1992, Pat. No. 5,374,412, which is a continuation-in-part of Ser. No. 923,077, Jul. 31, 1992, abandoned.

[51] Int. Cl.[6] ................................. C23C 16/00
[52] U.S. Cl. ..................... 118/725; 118/715; 118/719
[58] Field of Search .................... 118/715, 719, 118/725

[56] References Cited

U.S. PATENT DOCUMENTS

| | | | |
|---|---|---|---|
| 4,123,989 | 11/1978 | Jewett | 118/725 |
| 4,861,533 | 8/1989 | Bertin | 264/81 |
| 4,923,716 | 5/1990 | Brown | 427/249 |
| 4,990,374 | 2/1991 | Keeley | 118/725 |
| 4,997,678 | 3/1991 | Taylor | 427/249 |
| 5,043,773 | 8/1991 | Precht | 437/100 |
| 5,071,596 | 12/1991 | Goela | 264/81 |

*Primary Examiner*—Richard Bueker
*Attorney, Agent, or Firm*—Wayne E. Nacker; Gerald K. White

[57] ABSTRACT

Silicon carbide is produced by chemical vapor deposition at temperatures from 1340°–1380° C., deposition chamber pressures of 180–200 torr, $H_2$/methyltrichlorosilane ratio of 4–10 and deposition rate of 1–2 μm/min. Furthermore, $H_2$ supplied as a part of the gas stream contains less than about 1 part per million (ppm) $O_2$ gas, and various means are provided to exclude particulate material from the deposition chamber. The silicon carbide is polishable to <5 Å RMS as measured on a Talystep mechanical profiler and has a thermal conductivity of at least about 300 W/mk. The silicon carbide is particularly suitable for applications where high polishability and thermal conductivity is desired, such as hard disc drives and read/write heads of head-disc assemblies, and also optical apparatus which require a very high polish.

7 Claims, 2 Drawing Sheets

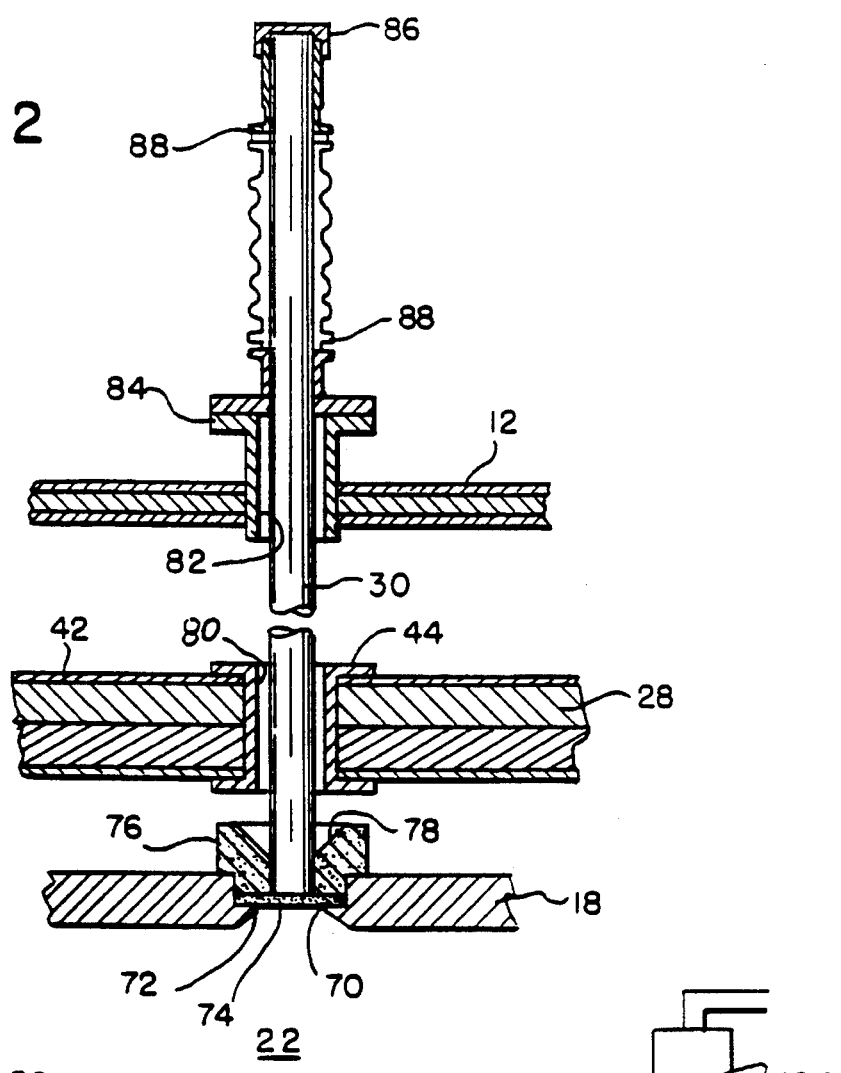
FIG. 2
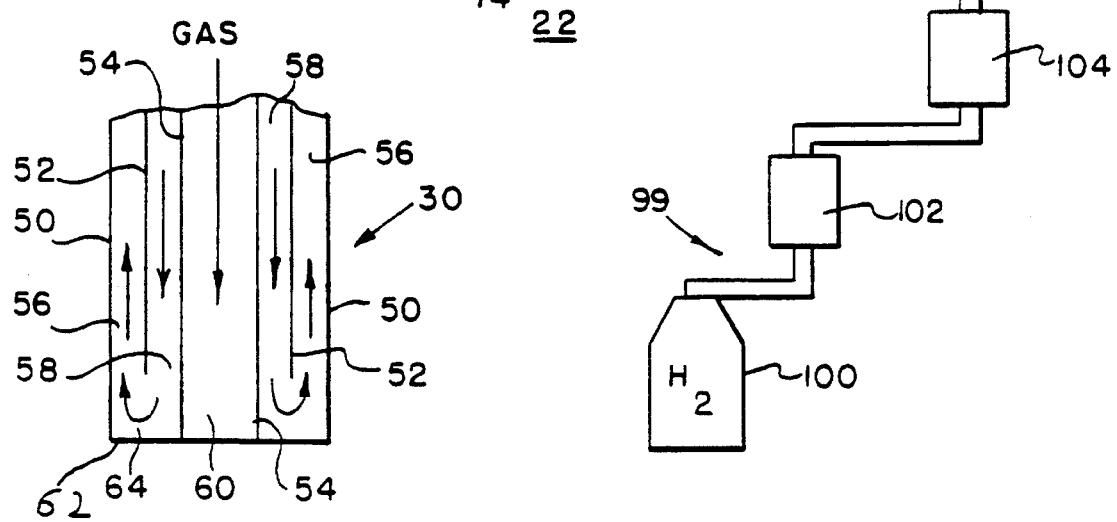
FIG. 3
FIG. 4

CHEMICAL VAPOR DEPOSITION FURNACE AND FURNACE APPARATUS

This is a Divisional of U.S. patent application Ser. No. 08/340,981 filed 17 Nov. 1994, which is a divisional of U.S. patent application Ser. No. 07/959,880 filed 13 Oct. 1992, now U.S. Pat. No. 5,374,412 issued 20 Dec. 1994, which, in turn, was a continuation-in-part of U.S. patent application Ser. No. 07/923,077 filed 31 Jul. 1992, now abandoned.

The present invention is directed to highly polishable, highly thermally conductive silicon carbide, production of such silicon carbide by chemical vapor deposition, and applications of such silicon carbide, particularly hard disc drives and read/write heads for head-disc assemblies.

BACKGROUND OF THE INVENTION

There exists a need for improved substrates for component parts of head-disc assemblies (also known as "Winchester drives"), particularly substrates for hard discs and read/write heads.

Currently, the most widely used substrate material for hard discs and read/write heads is aluminum or aluminum alloys. To produce a hard-disc from aluminum or an aluminum alloy, an aluminum or aluminum alloy substrate is blanked, thermal flattened, sized and chamfered and diamond-turned to a surface roughness of about 250 Å RMS. The blank is then chemically pretreated to remove aluminum oxide prior to coating with an undercoat layer. The undercoat layer is typically electroless nickel/phosphorous containing sufficient phosphorous so as to be non-magnetic. The nickel/phosphorous layer is polished and then textured. To the undercoat is then applied a magnetic coating, typically a cobalt/phosphorous alloy. Finally, a protective overcoat is applied, e.g., sputtered carbon. Additional layers and alternative procedures may be used, depending upon the manufacturer.

There is a continuing desire to achieve higher memory capacity on discs, including higher storage (bit) density and track density. Aluminum and aluminum alloy substrates have inherent limitations with respect to achieving higher storage and track density; hence, there is a desire for substitute materials. Among aluminum's and aluminum alloys' limitations with respect to their use as a substrate where high storage density is required are low elastic modulus, high coefficient of thermal expansion, and low Knoop hardness. Furthermore, aluminum exhibits poor chemical resistance, oxidation resistance, thermal stability and polishability. The poor polishability (limited to about 100 Å RMS) necessitates the nickel/phosphorous undercoat.

Several materials have been considered as alternatives to aluminum, as for example, as discussed in U.S. Pat. No. 4,808,463, the teachings of which are incorporated herein by reference.

Glasses have certain advantages relative to aluminum and aluminum alloys, e.g., very low coefficient of thermal expansion, but also have limitations as substrate for magnetic recording components; in particular, being electrically non-conductive, and having very low thermal conductivity (watts per meter per ° Kelvin (W/mK)).

Silicon carbide has a number of inherent properties which suggest its use as substrates for magnetic recording components, in particular, high specific stiffness, strength, hardness, thermal conductivity, low thermal expansion and chemical and oxidation resistance and is electrically conductive.

Silicon carbide produced by sintering (e.g., Japanese patent document 88-128885/19, 12 Sep. 1986 Hitachi KK) and reaction bonding (e.g., U.S. Pat. No. 4,598,017, the teachings of which are incorporated herein by reference) have been tested for use in magnetic recording media. To produce sintered silicon carbide, powdered silicon carbide is admixed with sintering aids and compacted using heat and pressure. The need for sintering aids results in the sintered silicon carbide having voids (sintered silicon carbide generally has a density of no greater than about 90% of theoretical density), impurities (residues of the sintering aids), and has relatively loosely bound crystals. Accordingly, sintered silicon carbide must be coated if it is to be used as a substrate for recording media. In reaction bonded silicon carbide, silicon fills the voids; thus reaction bonded silicon carbide is heterogeneous, the silicon detracting from desirable properties of silicon carbide. The best polishability of reaction-bonded SiC is about 30–50 Å RMS; sintered SiC is even less polishable.

It has been earlier proposed by others to evaluate silicon carbide which is deposited by chemical vapor deposition (CVD) as a candidate material for substrates of magnetic recording components. CVD-produced silicon carbide can closely approach 100% of theoretical density, has a tightly bound granular structure, and good polishability. Because CVD-produced SiC is highly polishable, it can be directly coated with a magnetic coating media, unlike aluminum or aluminum alloys which require application of a nickel/phosphorous undercoat prior to application of the magnetic coat.

Silicon carbide is generally deposited by CVD from a gaseous mixture of methyltrichlorosilane (MTS), $H_2$, and generally an inert or non-reactive gas such as argon, helium or nitrogen, argon being preferred. Free-standing SiC is typically pyrolytically deposited on a mandrel, such as a graphite mandrel, from which it is removable. The MTS is the preferred source of both the Si and C and provides these in stoichiometric (1:1) ratios. The $H_2$ scavenges Cl, producing HCl. The inert or non-reactive gas acts as a carrier gas for MTS (which is liquid at ambient temperatures); can be varied to adjust velocity of gas flow through the furnace as is necessary to sweep reaction product, such as HCl, from the deposited SiC; and acts as a diluent, preventing gas-phase reactions which might introduce impurities into the SiC.

CVD production of free-standing SiC material by providing a furnace having a deposition chamber and a mandrel therein and pyrolytically depositing SiC on the mandrel are described, for example, in U.S. Pat. Nos. 4,900,374; 4,997,678; and 5,071,596, the teachings of these patents being incorporated herein by reference.

The present invention is directed to CVD-deposited silicon carbide particularly suitable for magnetic recording media, particularly components of a head-disc assembly (HDA). The CVD produced in accordance with the invention has a combination of excellent thermal conductivity and high polishability not heretofore achieved in free-standing silicon carbide.

The fabrication of HDAs, including hard discs and read/write heads are described, for example, in R. W. Wood, "Magnetic Recording Systems", *Proc. of the IEEE,* 74(11), 1557–1569 (1986); C. Warren, "Rigid-disk Drives: Capacity, Performance Mount as Size Shrinks", *Electronic Design,* 28 Apr. 1983, pp. 139–150; Ivan Flores, "Chapter 5: External Storage" in *The Professional Microcomputer Handbook* (Van Nostrand Reinhold Co., New York, N.Y., 1986) pp.

111–151; U.S. Pat. No. 4,647,494; and articles in *IBM Disc Storage Technology* February 1980, including "Film Head Development" by D. A. Thompson et al. (pp.3–5) and "IBM 3370 Film Head Design and Fabrication" by R. E. Jones, Jr. (pp.6–9), the teachings of each of these being incorporated herein by reference.

High polishability is a very important attribute of a substrate for magnetic recording components of HDAs or the like. The areal density storage of a magnetic disc is determined by the size of the individual magnetic domains which can be achieved. The magnetic domain (or cell) size is directly related to the head fly height, i.e., the distance or gap by which the read/write head "flys" above the hard disc. The lower the fly height, the smaller the magnetic domains that can be achieved. Therefore, lower fly height translates into higher areal density. Fly height is controlled by a number of factors, surface smoothness being one of them. A limiting factor of the gap between the head and the disc (fly height) appears to be surface roughness. Surface roughness produces turbulence in the "air" gap between the disc and head, causing the head to crash into the disc if the gap is too narrow. Furthermore, lower fly heights translate to higher track density on the hard disc, increasing the overall memory storage capacity of the disc.

SUMMARY OF THE INVENTION

In accordance with the invention, free-standing silicon carbide is produced by chemical vapor deposition which has very high polishability, i.e., about 5 Å RMS or less as measured on a Talystep mechanical contact profiler and even as polishable to about 1 Å RMS or less. The CVD-deposited SiC has very high thermal conductivity, i.e., at least about 300 W/mK, a property advantageous in dissipating heat. The SiC is deposited at very specific deposition conditions using methyltrichlorosilane (MTS), $H_2$ gas and usually an inert carrier gas, which conditions include: a deposition chamber pressure of between about 180 and about 220 torr, a deposition chamber temperature of between about 1340 and about 1380° C., a deposition rate of between about 1.0 and about 2.0 μm/min., and an $H_2$/MTS gas partial pressure flow ratio of between about 4 and about 10. Furthermore, $H_2$ supplied as a part of the gas stream, is purified so that it contains less than about 1 part per million (ppm) $O_2$ gas, and various means are provided to exclude particulate contaminant material from the deposition chamber. The CVD-deposited SiC is machined to its end-use configuration, e.g., a hard disc or a read/write head, and highly polished on an appropriate surface or surfaces. To make a hard-disc, the highly polished surfaces (hard-discs are generally two-sided) are coated with magnetic recording media, e.g., a cobalt/phosphorous alloy magnetic media, and, generally, further coated with a protective overcoating, e.g., sputtered carbon. In a read/write head, read/write circuitry are fabricated on a highly polished surface of the silicon carbide, e.g., by photolithography. Additional layers may be included by different manufacturers. For example, there may be benefits to initially coating the SiC substrate with $Al_2O_3$ prior to applying the magnetic recording medium layer.

BRIEF DESCRIPTION OF THE DRAWINGS

FIG. 2 is an enlarged diagrammatic cross-sectional view of an injector nozzle extending to the deposition chamber of the furnace of FIG. 1.

FIG. 3 is a further enlarged diagrammatic cross-sectional view of the injector nozzle of FIG. 2.

FIG. 4 is a diagrammatic illustration of apparatus used in the hydrogen feed line to provide substantially oxygen-free hydrogen to the furnace.

DETAILED DESCRIPTION OF CERTAIN PREFERRED EMBODIMENTS

Figure 1:
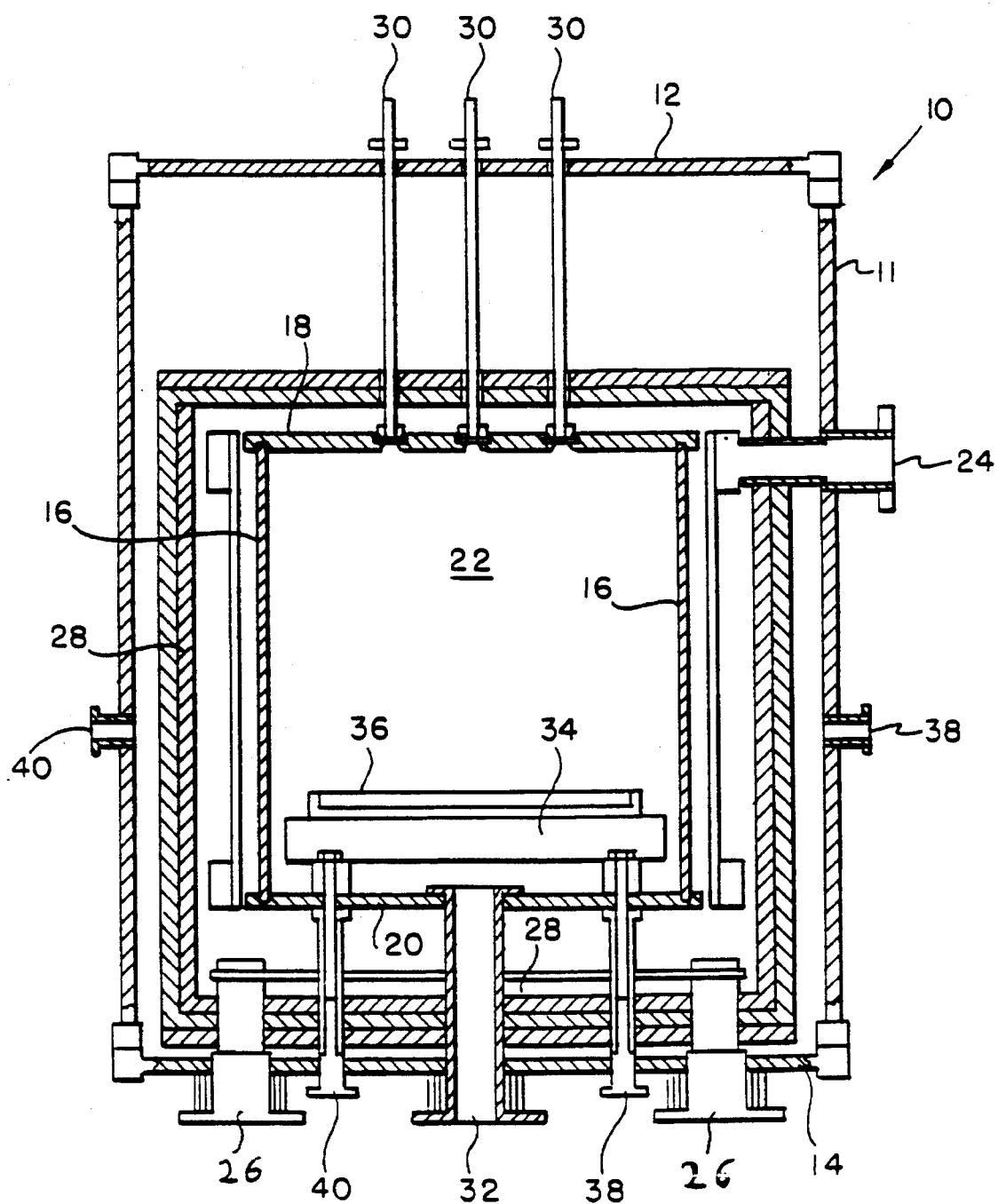
FIG. 1 is a diagrammatic cross-sectional view of a furnace used to produce SiC in accordance with the method of the present invention.

The present invention provides free-standing, cubic (β) phase SiC which is highly polishable, i.e., about 5 Å RMS or less, preferable about 3 Å RMS or less, and most preferably about 1 Å RMS or less as measured on a Talystep mechanical contact profiler. Herein, unless otherwise noted, polishability values are as measured on a Talystep mechanical contact profiler. The value of surface roughness (polishability) may vary significantly depending upon the measurement technique. For example, surfaces measured to be 1 Å RMS on a Talystep mechanical contact profiler would measure lower on a Zygo heterodyne profiler and larger on an atomic force microscope. A more detailed discussion of surface roughness measurements is found in J. M. Bennett, V. Elings and K. Kjoller, *Optics & Photonics* 2 (5) May 1991, pp. 14–18; J. M. Bennett and S. H. Dancy, *Appl. Opt.* 20, 1984, pp. 1785–1892. Free-standing SiC is to be distinguished from SiC films which are supported by and inseparable from a backing material in that free-standing sic can be unsupported and polished. Generally, the thinnest free-standing SiC which can be polished is between 5/1000 and 10/1000 of an inch (0.127–0.244 mm). (It may well be that some SiC thin films on extremely smooth substrates can be highly polished to an extent approaching or equaling that of the underlying substrate.)

As mentioned above, a high degree of polishability is desired in a substrate for magnetic recording components in order to achieve low fly heights between the read/write head and the hard disc in a head-disc assembly (HDA) and consequential high memory storage capacity. The high degree of polishability is also desirable for optical apparatus, e.g., SiC mirrors. High thermal conductivity is highly desirable for dissipating heat in components of HDAs.

Even though the polished surface may be subsequently coated with several coats of material, including magnetic recording media, an overcoat and optional other layers, any surface irregularities in the polished surface tend to be imparted to the subsequent layers, often in exaggerated form. A high polish also permits superior surface cleaning prior to subsequent coating, resulting in better bonding of the subsequent coating. This results in fewer rejected components.

A high thermal conductivity in magnetic recording components is highly desirable from the standpoint of dissipating heat which builds up during operation.

Thermal conductivity is strongly dependent on the grain size and purity of the material, i.e., the thermal conductivity increases with increasing grain size and low impurity concentration along the grain boundaries. The grain size and, therefore, the thermal conductivity, is controlled by the deposition temperature, pressure, and gas flow rates. For example, under conditions of high temperature and low MTS flow rate (which results in low MTS partial pressure), the grain size increases. As temperature is lowered and the MTS flow increases, the grain size decreases. SiC produced in accordance with the invention has a thermal conductivity of about 300 W/mK or above.

The polishability depends upon several factors. The SiC must be void-free, of high purity (no second phase material) and stoichiometric (equal number of Si and C atoms) in order to obtain highly polished surfaces. The stoichiometry depends upon the deposition temperature, pressure and $H_2$/MTS ratio. Also, the deposition rate must be relatively low in order to obtain a void-free material. The deposition rate is controlled by the deposition temperature, pressure and gas flow rates. The deposition rate increases with increasing temperature, pressure and MTS flow rate.

Herein, CVD-deposited, free-standing SiC having very high polishability and high thermal conductivity is deposited under very specific conditions. Certain parameters, such as individual gas-flow rates will vary according to the size and design of the particular CVD deposition furnace. It is found, however, that CVD-deposited, free-standing SiC having polishability of about 5 Å RMS or less, preferably about 3 Å RMS or less and most preferably about 1 Å RMS or less and thermal conductivity of at least about 300 W/mK is deposited under a very specific set of reaction conditions using the gas mixture of at least methyltrichlorosilane (MTS) and $H_2$; in particular: a furnace pressure of between about 180 and about 220 torr, a deposition temperature of between about 1340 and about 1380° C., preferably between about 1340° C. and about 1370° C., and most preferably about 1350° C., deposition rate of between about 1.0 and about 2.0 μm/min., and an $H_2$/MTS gas partial pressure flow ratio of between about 4 and about 10. Furthermore, $H_2$ supplied as a part of the gas stream is purified so that it contains less than about 1 part per million (ppm) $O_2$ gas, and various means are provided to exclude particulate contaminant material from the deposition chamber. The gas mixture almost always includes an inert gas, preferably argon, as a carrier for MTS and in an amount to adjust aerodynamic properties of the gas stream. However, it is conceivable that the process might be run using only MTS carried by $H_2$. Although these specific deposition parameters may fall within broad ranges described in afore-mentioned U.S. patents, it is demonstrated hereinafter, that the very specific set of deposition parameters set forth above achieve the combination of very high polishability and very high thermal conductivity not found in any actual deposition shown in the prior art.

With respect to "deposition chamber temperature," what is meant herein is the temperature as determined in the deposition chamber in close proximity to the mandrel on which the silicon carbide is being deposited, although the actual mandrel temperature may be slightly different. Experience has shown that temperatures at different locations relative to, but each closely adjacent the mandrel seldom vary more than about 5° C., and it is assumed that the actual deposition temperature at the mandrel is within 10° C. of the probed temperature.

Thermal conductivity is believed to be relatively consistent, regardless of method of measurement. Herein, thermal conductivity is the thermal conductivity as measured by flash lamp techniques.

Unless otherwise stated, all properties of SiC are measured herein at room temperature, i.e., 20°–28° C. (293°–301° K.).

Free-standing SiC is generally at least 5/1000 in thick (0.127 mm). For purposes of making hard discs and read/ write heads, SiC is generally deposited to a thickness of at least about 2–3 mm. The SiC substrate may be partially configured according to the particular mandrel on which the SiC is deposited, but is generally further configured and/or finished by machine tooling following deposition. The substrate is polished on a surface or surfaces according to the requirements of the component part by conventional means, such as lapping using pitch and progressively finer diamond abrasive.

In producing a magnetic recording component, e.g., a hard disc or a read/write head, after polishing a surface(s) to the desired degree, e.g., about 5 Å RMS or less, preferably about 3 Å RMS or less and most preferably about 1 Å RMS or less, magnetic recording media is deposited directly on the polished surface(s) by conventional means, such as electroless plating or a sputtering process. Magnetic recording media may be selected from a variety of magnetic materials or alloys such as GdCo, CoPtCr, and CrV-CoPtCr. Cobalt/phosphorous alloy is a currently preferred magnetic recording media. Typically, the magnetic recording media layer thickness is 500–1000 Å. To protect the magnetic recording media layer, it is preferred that the magnetic recording media layer be overcoated with a protective layer, such as sputtered carbon, to a thickness of 200–500 Å. The component may be further surface-lubricated to improve stiction/friction performance.

Properties of SiC produced in accordance with the invention and advantages with respect to magnetic recording components are summarized in the table below:

| PROPERTY | ADVANTAGE |
| --- | --- |
| High Polishability | Low fly-heights |
|  | High storage density |
| High Specific Stiffness | Low fly-heights |
|  | Thin discs |
|  | Low weight |
| High Thermal Conductivity | Heat dispersion |
|  | Low distortion |
| Chemical, Oxidation Resistance | Reliability, low error rates |
| Hardness (Scratch Resistant) | High yields |
|  | Low contact damage |
|  | Durability |
| Thermal Stability | Low fly-heights |
| Electrical Conductivity | No static charge build-up |
| High Yield Strength | Low breakage |
|  | High in-process yield |
| Low Thermal Expansion | Low distortion from temp. change |
| Dimensional Stability (Low Stress) | No "bowing" during cutting (heads) |
| Good Machinability | No "chipping" sharp edges |
|  | Minimal edge roll-off. |

To achieve very high thermal conductivity, i.e., about 300 W/mK or above, along with very high polishability, it has been found necessary to substantially exclude from the deposition chamber both oxygen, which tends to cause deposition of carbon inclusions, and particulates, which may become inclusions in the deposited CVD. The main source of oxygen is generally the hydrogen gas, and means are provided to reduce to and maintain the presence of oxygen in the hydrogen gas stream to less than about 1 ppm. Likewise, means are provided for maintaining the deposition chamber substantially free of particulates or other possible inclusions. Applicants' approach to substantially eliminating oxygen and particulates is described below with respect to FIGS. 1–4. It is to be understood that other means may be employed to eliminate oxygen and particulates, depending upon the apparatus used. The figures only illustrate those portions of the apparatus which are modified for reducing particulates, as general CVD apparatus for depositing silicon carbide are known, e.g., in patents referenced above.

Illustrated in FIG. 1 is a diagrammatic cross-sectional illustration of a 0.5-m CVD-SiC furnace 10 adapted by Applicants for depositing their highly polishable, highly thermal conductive SiC. The apparatus includes an outer wall or housing comprising a cylindrical sidewall 11, a top plate 12 and a bottom plate 14. An inner wall or housing comprises a cylindrical sidewall (or isolation tube) 16, a top cover 18 and a bottom cover 20; the inner wall defines the inner space which is the deposition chamber 22. Surrounding the isolation tube 16 is a side heater 24; below the bottom cover 20 is a bottom heater 26. Each of the heaters 24,26 are of the electrical resistive type, e.g., being formed of graphite glow bars.

Interposed between the inner housing and outer housing and surrounding the inner housing and heaters 24,26 are batts of insulating material 28 which are usually formed of fibrous material, e.g., carbon fibers. As will be explained in greater detail in respect to FIG. 2, these batts 28 are a source of particulate material, for example, during furnace disassembly; and means are provided for eliminating the batts as a source of particulate material to the deposition chamber. Injector means 30 provide for entry of gas through the upper end of the furnace an to the deposition chamber; in the illustrated furnace 10. three injectors 30 are illustrated. As will be explained in greater detail with respect to FIG. 2, the injectors are a potential source of particulates, including relatively large particulates, and the injectors 30 in the illustrated furnace have been modified from previous injector design to eliminate the injectors 30 as a source of particulate material in the deposition chamber 22. An exhaust tube 32 communicates with the lower end of the deposition chamber 22.

In the deposition chamber 22 interposed in the flow of gas, is a baffle plate 34 which is supported just above the bottom cover 22 in a horizontal orientation. Supported above the baffle plate 34, also in a horizontal orientation, is the mandrel 36 on which the bulk CVD SiC is deposited. Deposition chamber 22 temperature is monitored by thermoconductors 38 and optical pyrometers 40.

Although not illustrated in detail herein, the furnace is disassembled through the bottom between each run. During disassembly, there is a tendency for particulates breaking off from the carbon felt insulation 28 to contaminate the deposition chamber 22. To prevent this, protective ceramic blankets or covers are provided over the carbon felt batts 28. The cover means illustrated in FIG. 2 comprise cover sheets of non-porous ceramic gasket material 42, for example graphite, such as that sold under the tradename Graffoil, and carbon sleeves 44 capping orifices through the batts 28.

In previous furnace designs, the injectors 30 have been the source of particulate material which drops onto the mandrel 36 below and the SiC being deposited thereon. As diagrammatically illustrated in FIG. 3, each injector 30 is comprised of three concentric tubes which define annular passageways 56 and 58 and a central passageway 60. The central passageway 60 is the gas passageway and is open at its lower end to communicate with the deposition chamber 22. An annular cap 62 extends between the outer and inner tubes 50,54, sealing the lower end of the annular passageways 56,58 to each other. The lower end of the middle tube 52 is spaced above the annular cap 62 to provide a gap 64 that communicates the annular passageways 56,58. A coolant, usually water, is pumped downward through the inner annular passageway 58 and returns through the outer annular passageway 56. This coolant prevents deposition from occurring in the gas flow passageway 60 in the heated region where it communicates with the deposition chamber 22 by keeping the passageway 60 below the deposition temperature.

It is to be appreciated that the injector tube 30 must be movable relative to at least the top plate or cover 12 of the outer housing or the top cover 18 of the inner housing because of the different temperatures of each of the housings and the resulting difference in expansion and contraction during furnace operation. In previous furnace designs (not shown) the lower end of the injector tube extended downward bellow the top cover 18 of the inner housing and into the deposition chamber 22 to ensure continual communication between the central passage of the injector and the deposition chamber. This was found to be problematic in that the cooler injector tended to promote condensation and film build-up thereon, which deposition might flake off and fall onto the mandrel 36 therebelow and become large particulate inclusions in the SiC being deposited thereon.

To overcome this problem, the injector tubes 30 have been adapted to extend downward to, but not into, the deposition chamber 22, providing continuous communication with the deposition chamber, while being relatively slidable relative to the top plate 12 of the outerhousing. Illustrated in FIG. 2 is applicants' design for injector apparatus which provides for the injector tube 30 extending to, but not into, the deposition chamber 22. An inlet opening 70 in the top cover 18 of the inner housing is shaped to provide an annular ledge 72. Seated in the opening 70 on the ledge 72 is a carbon washer 74 of appropriate interior diameter that the injection tube 30 seats thereontop. To facilitate seating of the injector tube 30 on the washer 72 during furnace assembly, a tubular carbon guide 76 having a tapered upper end 78 also is seated in the opening 70 on the washer 72. The injector tube 30 extends upwards through openings 80, 82 in the insulation 28 and top plate 12.

It is important that the openings in the outer housing, including the opening 82, through which the injector tube 30 extends, be sealed. Accordingly, a flanged sleeve 84 is provided at the opening 82, fixed to the top plate 12. The injector tube 30 is vertically movable through the flanged sleeve 84 to accommodate differential thermal expansion of the inner and outer housings. A coupling 86 is provided around the injector tube 30 at a location above the top plate 12. Providing a seal between the coupling 86 and the flanged sleeve 34 is a bellows 90 that accommodates relative vertical movement between the top plate 12 and the injector tube 30. To provide for disassembly and assembly, the illustrated bellows provides for attachment and separation 88 at two points; O-rings 88 at these points provide a gas-tight seal during operation.

As discussed briefly above, another source of inclusions which detract from uniform deposition of SiC is the presence of oxygen. In examination of previous depositions, small carbon inclusions could be found. Also, it was noted in SiC depositions that bands of carbon inclusions tended to form when hydrogen cylinders were changed, indicating that oxygen might be the culprit. To avoid changing hydrogen cylinders, sufficiently large hydrogen cylinders are now being employed to supply an entire deposition run. Nevertheless, commercially available hydrogen sources tend to contain amounts of oxygen which, though very minor, are significant with respect to producing carbon inclusions in CVD-SiC. Accordingly, to produce the SiC of the present invention, it was found necessary to purify the hydrogen gas, particularly to substantially eliminate trace oxygen from the hydrogen.

Illustrated in FIG. 4 is a schematic of a hydrogen gas line 99 which applicants have modified to eliminate oxygen and some other gaseous impurities. The hydrogen gas line confluences with a flow of argon-carried MTS (not shown), and the combined flow of argon, hydrogen and MTS is introduced into the deposition chamber 22 through the injectors 30. The gas line includes the hydrogen source 100. Downstream from the hydrogen source 100 is a catalytic purifier 102, such as Resource Systems, Inc., Model RCP-500. which converts oxygen to water. Downstream of the catalytic purifier 102 is a molecular sieve dryer 104, such as Resource Systems, Inc., Model MSD-1000. which traps the water. The system reduces the oxygen content of the hydrogen gas stream to below 1 ppm. This system is also capable of removing carbon dioxide, ammonia and other undesirable polar molecules. Although this system represents Applicants' current preferred method of removing $O_2$ from the $H_2$ gas stream, other means, such as a gettering system, might be employed for this purpose.

The invention will now be described in greater detail by way of specific examples.

EXAMPLE 1

Conditions were optimized for a 0.5-m and a 1.5-m production furnace of Morton Advanced Materials, Woburn Mass., which conditions are given in the table below. It is to be appreciated that chemical vapor deposition furnaces, as are those used in this example, are custom manufactured, and that specific conditions of flow rate may vary from furnace to furnace. To produce CVD-deposited SiC in accordance to the invention, temperature, pressure, $H_2$/MTS ratio and deposition rate should be within the ranges set forth below, regardless of specific furnace design.

| Process Parameter | 0.5-m Furnace | 1.5-m Furnace |
| --- | --- | --- |
| Furnace Pressure | 200 torr | 200 torr |
| Deposition Temperature | 1350 °C. | 1350 °C. |
| Gas Flow Rates: | | |
| $H_2$ | 28 slpm | 140 slpm |
| Ar | 72 slpm | 550 slpm |
| MTS | 5.6 slpm | 28 slpm |
| Gas Partial Pressures: | | |
| $H_2$ | 53 torr | 39 torr |
| Ar | 136 torr | 153 torr |
| MTS | 10.6 torr | 7.8 torr |
| Deposition Rate: | 1.5 μm/min | 1.9 μm/min |
| $H_2$/MTS Gas Flow Ratio: | 5 | 5 |

EXAMPLE 2

Using the 0.5-m Furnace of Example 1, CVD-SiC is deposited in accordance with the conditions described in U.S. Pat. No. 4,990,374 lines 30–36, i.e.: deposition temperature 1300° C.; furnace pressure 200 torr; gas partial pressures Ar 68 torr, $H_2$ 102 torr and MTS 30 torr. The following table compares properties of the SiC deposited using the conditions in Example 1 with the SiC deposited in accordance with U.S. Pat. No. 4,990,374. (Values specified room temperature measurements values (20°–25° C.).

| Property | Example 1 Conditions | 4,990,374 Cond. |
| --- | --- | --- |
| Crystal Structure | FCC, polycrystalline | FCC, polycryst. |
| Grain Size (μm) | 17 | 8 |
| Density (g/cm$^{-3}$) | 3.21 | 3.21 |
| Hardness (Knoop, g load) | 2500 | 2500 |
| Chemical Purity | 99.999% SiC | Unknown |
| Flexural Strength, 4-point (MPa) | 430 | 490 |
| Elastic Modulus | 466 | Unknown |
| Coefficient of Thermal Expansion (K$^{-1}$) | $2.2 \times 10^{-6}$ | $2.2 \times 10^{-6}$ |
| Thermal Conductivity | >300 W/mK | 100–145 W/mK |
| Polishability | <1 Å RMS | ~10 Å RMS |

Of the above properties, polishability of the SiC deposited in accordance with the invention is of great significance for substrates for magnetic recording components and also optical components requiring a very high degree of polishability. Improved thermal conductivity is also of important significance for substrates for magnetic recording components.

EXAMPLE 3

In a 70 hr. run, CVD-SiC was deposited in a 0.5 mm furnace under the following conditions:

| | |
| --- | --- |
| Furnace Pressure | 200 torr |
| Deposition Temperature | 1350° C. |
| Gas Flow Rates: | |
| $H_2$ | 28 slpm |
| Ar | 77 slpm |
| MTS | 5.9 slpm |
| Gas Partial Pressures: | |
| $H_2$ | 50 torr |
| Ar | 139 torr |
| MTS | 10.6 torr |
| Deposition Rate | 1.5 μm/min |
| $H_2$/MTS Gas Flow Ratio | 4.7 |

The CVD-SiC has a thermal conductivity of 304.9 W/mK at 28° C. (301° K.) and is polished to <1 Å RMS.

While the invention has been described in terms of certain preferred embodiments, modifications obvious to one with ordinary skill in the art may be made without departing from the scope of the invention.

Various features of the invention are set forth in the following claims.

What is claimed is:

1. In an apparatus comprising a chemical vapor deposition furnace, a hydrogen gas source, an input-line for introducing the hydrogen gas into said deposition furnace, a reactive gas or vapor source, an input line for introducing the reactive gas or vapor into said deposition furnace, wherein the improvement comprises means in said hydrogen input line for removing oxygen gas from the hydrogen gas.

2. The apparatus according to claim 1, said oxygen-removing means reducing the content of oxygen gas in said hydrogen gas to about 1 ppm or below.

3. The apparatus according to claim 1, said oxygen-removing means comprises a catalytic purifier which converts $O_2$ to water.

4. The apparatus according to claim 3 wherein said oxygen-removing means further comprises a molecular sieve drier downstream of said catalytic purifier for removing water from the hydrogen gas.

5. In a furnace for chemical vapor deposition comprising an outer housing, an inner housing defining an inner chamber, means for heating said inner housing and said inner chamber to a higher temperature than said outer housing, inlet tube means extending through inlet opening means in said outer housing and having gas passageway means in communication with said inner chamber and also having coolant passageway means, and gas outlet means communicating with said inner chamber and extending through outlet opening means in said outer housing, wherein the improvement comprises means to maintain said inlet tube means with said gas passageway means in communication with said inner chamber but with said inlet tube means not extending into said inner chamber, said inlet means being movable relative to said inlet opening means in said outer housing to accommodate differential thermal expansion of said inner housing and said outer housing, thereby preventing material that is condensed or deposited on said inlet tube means within said inner chamber from falling into said inner chamber.

6. A furnace according to claim 5 wherein means are provided for sealing said inlet opening means around said inlet tube means.

7. In a furnace for chemical vapor deposition comprising an outer housing, an inner housing defining an inner chamber, inlet means and outlet means extending through said outer housing and communicating with said inner chamber for passage of gases through said inner chamber, heating means for heating said inner chamber, ceramic fiber insulation insulating said inner housing and said heating means from said outer housing, and access means for inserting objects into and subsequently removing objects from said inner chamber, the improvement comprising a protective ceramic blanket for covering said ceramic fiber insulation so as to minimize contamination of said inner chamber by particulates of said ceramic fiber.

* * * * *